US012363405B2

(12) United States Patent
Kimura (10) Patent No.: US 12,363,405 B2
(45) Date of Patent: Jul. 15, 2025

(54) IMAGE CAPTURING APPARATUS (71) Applicant: CANON KABUSHIKI KAISHA, Tokyo (JP)

(72) Inventor: Yasunori Kimura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 232 days.

(21) Appl. No.: 18/327,137

(22) Filed: Jun. 1, 2023

(65) Prior Publication Data
US 2023/0403448 A1 Dec. 14, 2023

(30) Foreign Application Priority Data
Jun. 13, 2022 (JP) ................. 2022-094999

(51) Int. Cl.
*H04N 23/51* (2023.01)
*H04N 23/52* (2023.01)
*H05K 7/20* (2006.01)

(52) U.S. Cl.
CPC ............. *H04N 23/51* (2023.01); *H04N 23/52* (2023.01); *H05K 7/20136* (2013.01)

(58) Field of Classification Search
CPC ..... H04N 23/51; H04N 23/52; H05K 7/20136
See application file for complete search history.

(56) References Cited

U.S. PATENT DOCUMENTS

| 8,035,733 | B2 | 10/2011 | Mukai | |
|---|---|---|---|---|
| 2017/0353635 | A1* | 12/2017 | Shin | H04N 23/51 |
| 2019/0154949 | A1* | 5/2019 | Hosoe | G05D 23/1919 |
| 2020/0033592 | A1* | 1/2020 | Crespo | B60R 11/04 |
| 2020/0412962 | A1* | 12/2020 | Yamauchi | H04N 23/60 |
| 2022/0408712 | A1* | 12/2022 | Wada | H04N 23/51 |
| 2023/0296962 | A1* | 9/2023 | Lee | H04N 23/51 |
| | | | | 359/557 |

FOREIGN PATENT DOCUMENTS

JP 4404120 B2 1/2010

* cited by examiner

*Primary Examiner* — Amy R Hsu
(74) *Attorney, Agent, or Firm* — Carter, DeLuca & Farrell LLP (57) ABSTRACT An image capturing apparatus that curbs an increase in size thereof while performing forced air cooling of a substrate includes a camera unit, a first unit configured to rotatably support the camera unit around an axis in a first direction, a second unit configured to rotatably support the first unit around an axis in a second direction, a first substrate configured to be fixed to the first unit, and a radiating unit configured to be fixed to the second unit and to allow heat generated by at least the first substrate to be dissipated to an outside of the image capturing apparatus, in which at least one inlet port and an exhaust port are formed in the heat dissipation unit, and the inlet port is configured to face the first unit and the exhaust port is disposed on a side surface of the second unit, in which the first unit has a base portion, a support portion configured to protrude toward the camera unit and formed on a first surface of the based portion, and at least one protrusion portion configured to protrude toward the second unit and formed on a second surface that is a surface on an opposite side to the first surface of the base portion.

17 Claims, 9 Drawing Sheets

IMAGE CAPTURING APPARATUS

BACKGROUND OF THE INVENTION

Field of the Invention

The present invention relates to an image capturing apparatus such as a video camera equipped with a heat dissipation unit.

Description of the Related Art

In the camera industry that uses a video camera and the like, camera units capable of pan and tilt rotation operations are widely spread. Among them, particularly in recent years, for example, as disclosed in Japanese Patent No. 4404120, there have been an increasing number of devices that are equipped with a large image capturing sensor in the camera unit and that can acquire and distribute high-quality images. It is necessary to install a substrate with high power consumption to deliver a high-definition video with a high image quality, but due to design restrictions, a substrate with high power consumption may be disposed on a pan base. When there is an intention for heat dissipation of this substrate with high power consumption only by natural air cooling, there is a problem that a main body of the image capturing apparatus is increased in size. Therefore, to prevent the main body of the image capturing apparatus from being increased in size, it is conceivable to install a heat dissipation unit for forced air cooling.

However, when the heat dissipation unit for forced air cooling is disposed in the pan base unit, a weight of the pan base unit increases and a rotational acceleration of the pan rotation operation decreases. In recent years, video cameras capable of pan and tilt rotations have been required to track a subject at high speed, so an image capturing apparatus capable of forced air cooling the substrate without increasing the main body of the image capturing apparatus in size becomes important.

SUMMARY OF THE INVENTION

Accordingly, one of the objects of the present invention is to provide an image capturing apparatus capable of curbing an increase in size of the image capturing apparatus while performing forced air cooling of a substrate.

An image capturing apparatus according to one aspect of the present invention is an image capturing apparatus configured to capture an image of a subject and includes a camera unit, a first unit configured to rotatably support the camera unit around an axis in a first direction, a second unit configured to rotatably support the first unit around an axis in a second direction, a first substrate configured to be fixed to the first unit, and a radiating unit configured to be fixed to the second unit and to allow heat generated by at least the first substrate to be dissipated to an outside of the image capturing apparatus, in which at least one inlet port and an exhaust port are formed in the heat dissipation unit, and the inlet port is configured to face the first unit and the exhaust port is disposed on a side surface of the second unit, in which the first unit has a base portion, a support portion configured to protrude toward the camera unit and formed on a first surface of the based portion, and at least one protrusion portion configured to protrude toward the second unit and formed on a second surface that is a surface on an opposite side to the first surface of the base portion.

Further features of the present invention will become apparent from the following description of exemplary embodiments with reference to the attached drawings.

DESCRIPTION OF THE EMBODIMENTS

Hereinafter, embodiments of the present invention will be described in detail with reference to the accompanying drawings. The following embodiments do not limit the invention according to a scope of the claims. Even if a plurality of features are described in the following embodiments, not all of the plurality of these features are essential to the invention, and moreover, the plurality of features may be combined arbitrarily. Furthermore, in the accompanying drawings, the same or similar constituents will be denoted by the same reference numerals, and redundant description thereof will be omitted.

First Embodiment

Figure 1A:
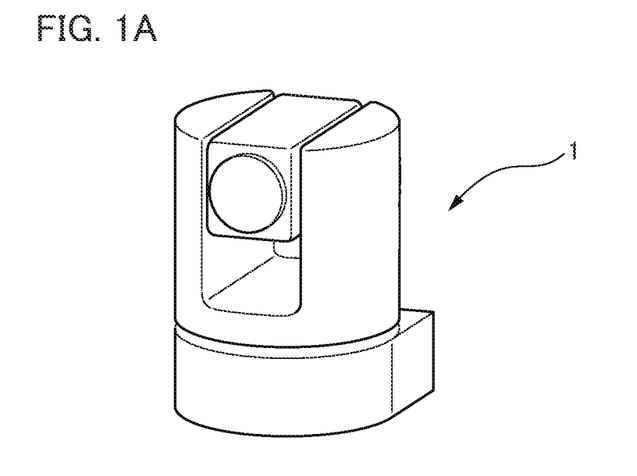
FIGS. 1A and 1B are an external view and an exploded perspective view of a video camera according to an embodiment.
Figure 1B:
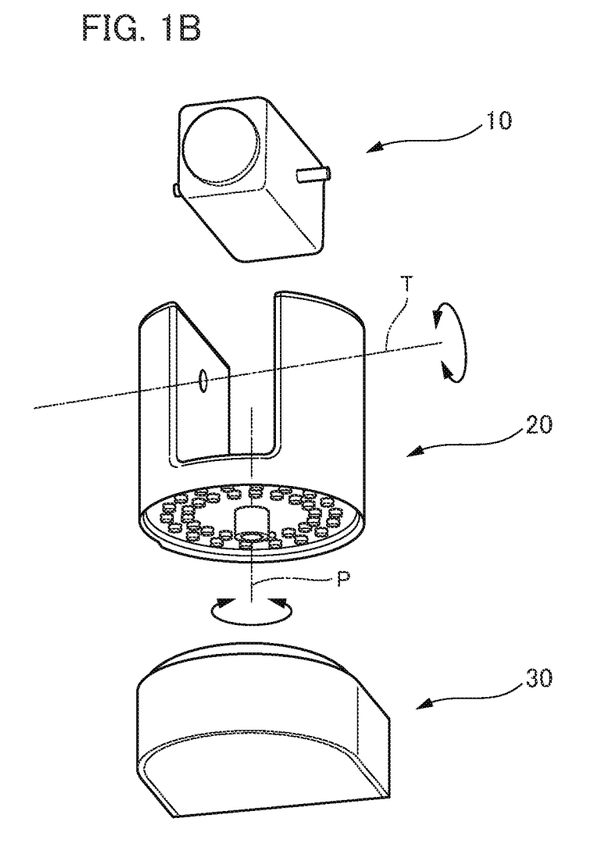

FIG. 1 shows an external view and an exploded perspective view of a video camera according to a first embodiment. FIG. 1A is an example of an external view of a video camera 1 according to the first embodiment. FIG. 1B is an example of an exploded perspective view of the video camera 1 shown in FIG. 1A.

As shown in FIG. 1, the video camera 1 of the first embodiment is an image capturing apparatus that includes a camera unit 10, a pan base unit 20, and a base unit 30.

The camera unit 10 is an image capturing mechanism for photographing a subject, and is configured to include a lens portion for forming an image of light, an image capturing element that converts light into an analog signal according to the formed image of light, and the like. The lens portion has a zoom function for adjusting an angle of view, a diaphragm function for adjusting an amount of light, and the like. The image capturing element has a gain function that adjusts sensitivity when converting light into an analog signal. These functions are adjusted on the basis of a predetermined setting value.

The pan base unit 20 supports the camera unit 10 so that it can tilt and rotate about a tilt rotation axis T. That is, the pan base unit 20 can cause the camera unit 10 to rotate in a vertical direction (vertically) with a horizontal direction (a first direction) as an axis.

The base unit (a second unit) 30 supports the pan base unit 20 so that it is pan rotatable about a pan rotation axis P. That is, the base unit 30 can cause the pan base unit 20 to rotate in the horizontal direction (a left and right direction) with the vertical direction (the second direction) as an axis. By pan-rotating the base unit 30, the camera unit 10 also rotates in the horizontal direction in conjunction with the pan base unit.

Here, examples of a structure that enables tilt rotation and pan rotation include a drive structure configured from motors, gears, belts, springs, screws, and the like, a structure fixed with elastic parts such as a wave washer and a sheet metal, screws, and the like, and a meshing structure that uses gears, and the like.

With the configuration described above, the camera unit 10 of the first embodiment can change a facing direction thereof in accordance with a rotation (a tilt rotation) about an axis in the horizontal direction (the first direction) and a rotation (a pan rotation) about an axis in the vertical direction (the second direction). This allows the camera unit 10 to take photographs in any direction around the video camera 1.

Figure 2:
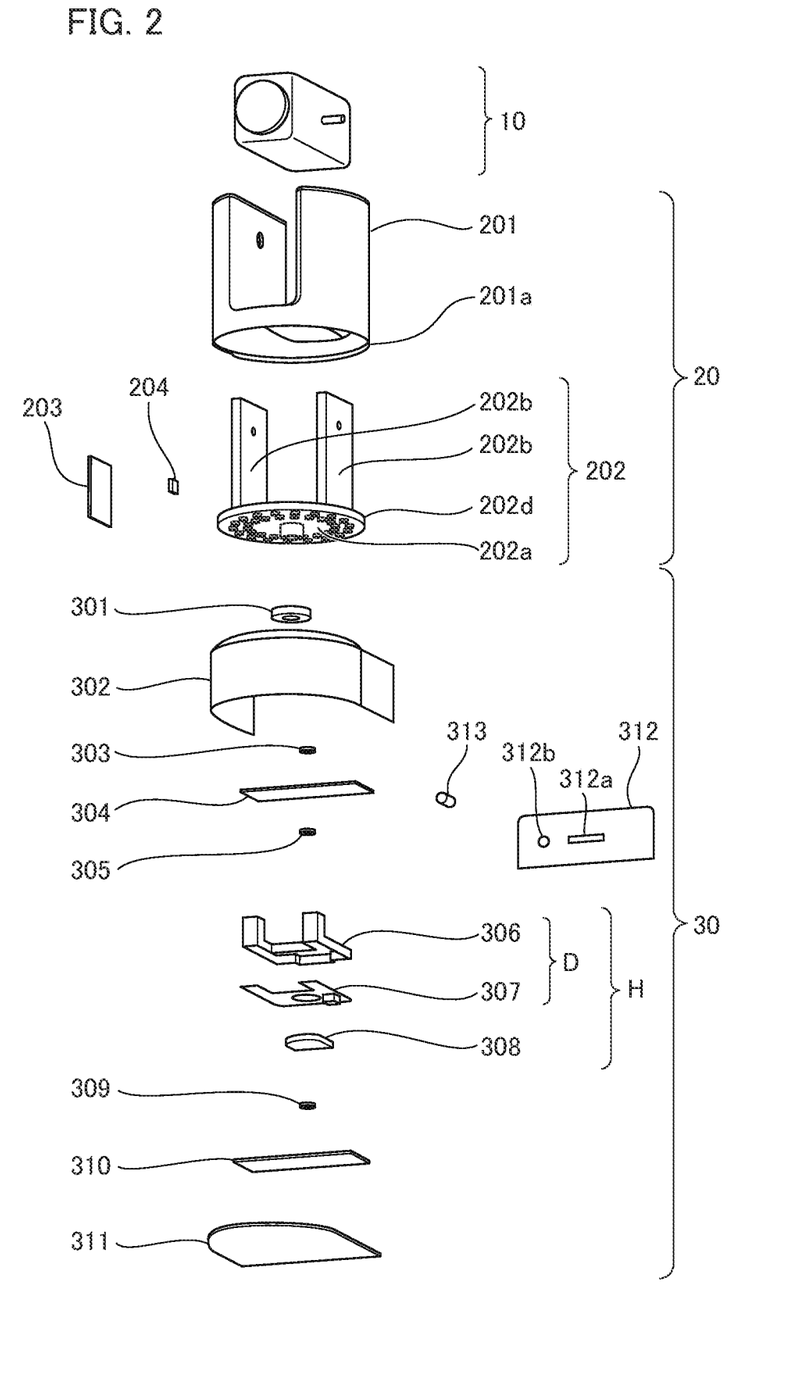
FIG. 2 is a detailed exploded perspective view of the video camera according to the embodiment.
Figure 3A:
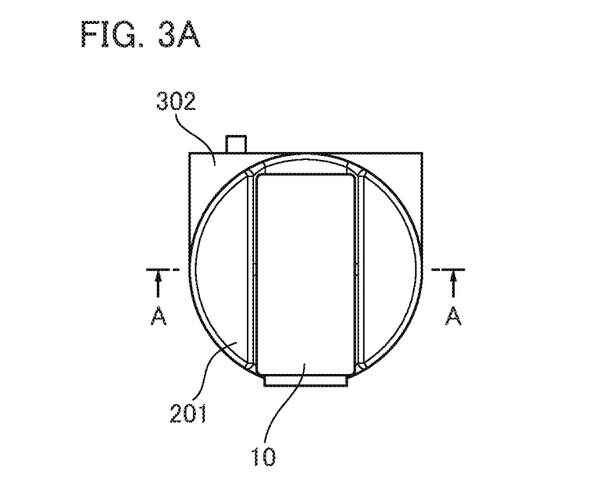
FIGS. 3A and 3B are a view, which is viewed from an upper surface side, and a cross-sectional view of the video camera according to the embodiment.
Figure 3B:
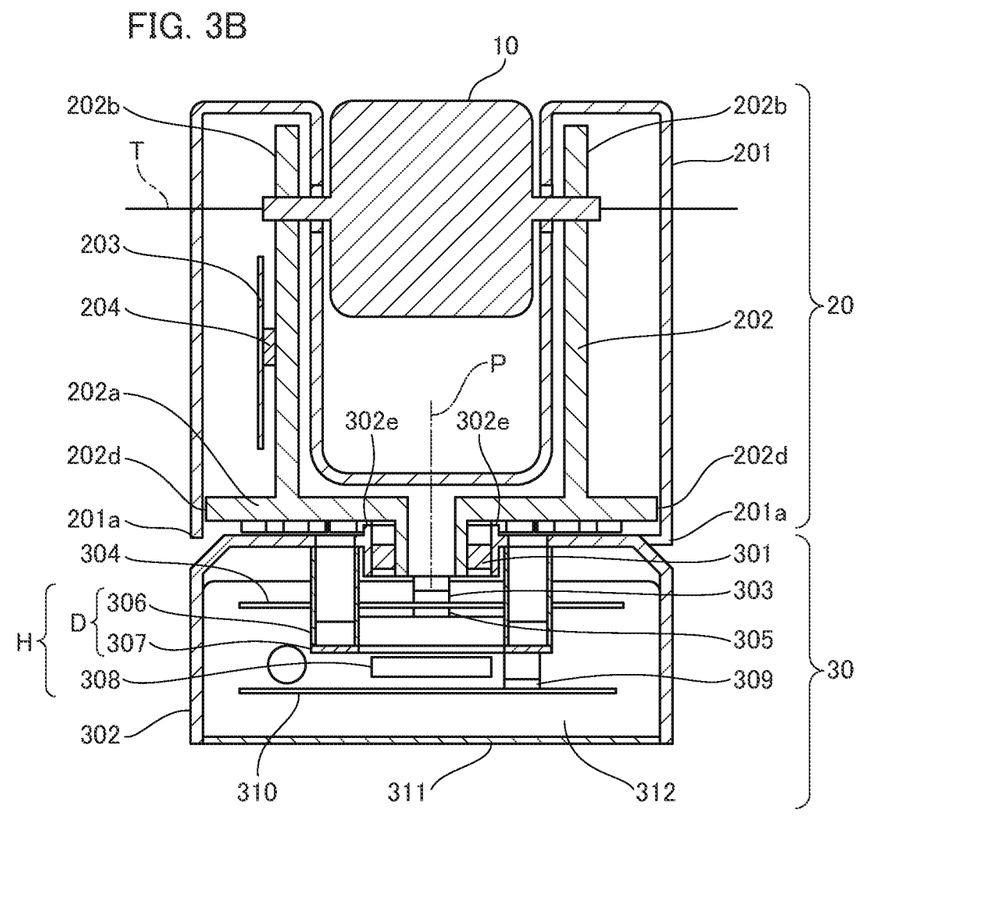

FIG. 2 is a detailed exploded perspective view of the video camera 1 according to the first embodiment. FIG. 3 is an example of a view, which is viewed from the upper surface side, and a cross-sectional view of the video camera 1 of the first embodiment. FIG. 3A is a view of the video camera 1 of the first embodiment, which is viewed from the upper surface side. FIG. 3B is an example of a cross-sectional view, which is viewed from a cross section A shown in FIG. 3A.

The pan base unit 20 can be configured from a pan base case 201, a pan base 202, a first substrate 203, and a first thermally conductive member 204.

The pan base case (an exterior part) 201 is configured as an exterior of the pan base unit 20 and is formed to cover the pan base 202 and the first substrate 203. In addition, the pan base case 201 also has a pan base case bottom portion 201*a* which is a bottom portion of the pan base case 201.

The pan base (a first unit) 202 functions as a frame of the pan base unit 20, and is configured from a pan-base base portion 202*a*, a pan-base support portion 202*b*, a protrusion portion 202*c*, and a pan-base outer peripheral portion 202*d*. In addition, it is desirable that the pan base 202 be partially or entirely formed of a metal material to improve heat dissipation performance.

The pan-base base portion 202*a* constitutes a bottom portion of the pan base 202. A pair of pan-base support portions 202*b* are formed to protrude toward the camera unit from a surface (a first surface) of the camera unit 10 side of the pan-base base portion 202*a*. In the first embodiment, the pair of pan-base support portions 202*b* are formed in the pan-base base portion 202*a* to face each other through the camera unit 10. In addition, it is desirable that the pan-base base portion 202*a* and the pan-base support portion 202*b* be partially or entirely formed of a metal member (a metal material) to improve heat dissipation performance.

The protrusion portion (a heat dissipation fin) 202*c* is a protrusion formed on a surface (a second surface) of the pan-base base portion 202*a* toward a side of the base case 302, which is opposite to a surface on the camera unit 10 side. In the first embodiment, a plurality of protrusion portions 202*c* are formed. Although it is desirable to form the plurality of protrusion portions 202*c*, at least one may also be formed. The pan-base outer peripheral portion 202*d* is an outer peripheral portion of the pan-base base portion 202*a*.

The pan base case 201 and the pan-base support portion 202*b* are each provided with two hole portions as shown in FIG. 2. Then, when the pan base unit 20 is assembled, respective hole portions provided in the pan base case 201 and the pan-base support portion 202*b* are formed such that centers of the hole portions (central axes of the hole portions) are positioned at substantially the same position. Then, the pan base unit 20 can support the camera unit 10 in a tilt-rotatable manner by holding the two holding portions protruding from a side surface of the camera unit 10 to be incorporated into the respective hole portions.

The first substrate 203 is a print substrate on which a video processing engine, a communication processing engine, a memory, and the like (not shown) are mounted, and which generates heat by implementing each processing or the like. The first substrate 203 is fixed to the pan base 202 by a fixing member such as a screw or the like (not shown). The first thermally conductive member 204 is fixed to be interposed between the first substrate 203 and the pan base 202 and conducts heat generated from the first substrate 203 to the pan base 202.

The base unit 30 can be configured from a pan rotation bearing 301, the base case 302, a bottom case 311, and a backside case 312. In addition, the base unit 30 of the first embodiment is configured to include a fourth thermally conductive member 303, a second substrate 304, a heat dissipation unit H, a second thermally conductive member 305, a third thermally conductive member 309, and a third substrate 310, and an external connection terminal 313.

The base case 302 is configured as an exterior and a frame of the base unit 30. The pan rotation bearing 301 supports the pan base 202 so that it is rotatable about the pan rotation axis P in the pan rotation direction with respect to the base case 302. As a result, the base unit 30 can support the pan base unit 20 so that it is pan rotatable.

The second substrate 304 is a print substrate on which the video processing engine, the communication processing engine, the memory, and the like (not shown) are mounted, and which generates heat by implementing each processing or the like, and is fixed to the base case 302 by a fixing member such as a screw or the like (not shown). The fourth thermally conductive member 303 is fixed to be interposed between the second substrate 304 and the base case 302 and conducts heat generated from the second substrate 304 to the base case 302.

Figure 4A:
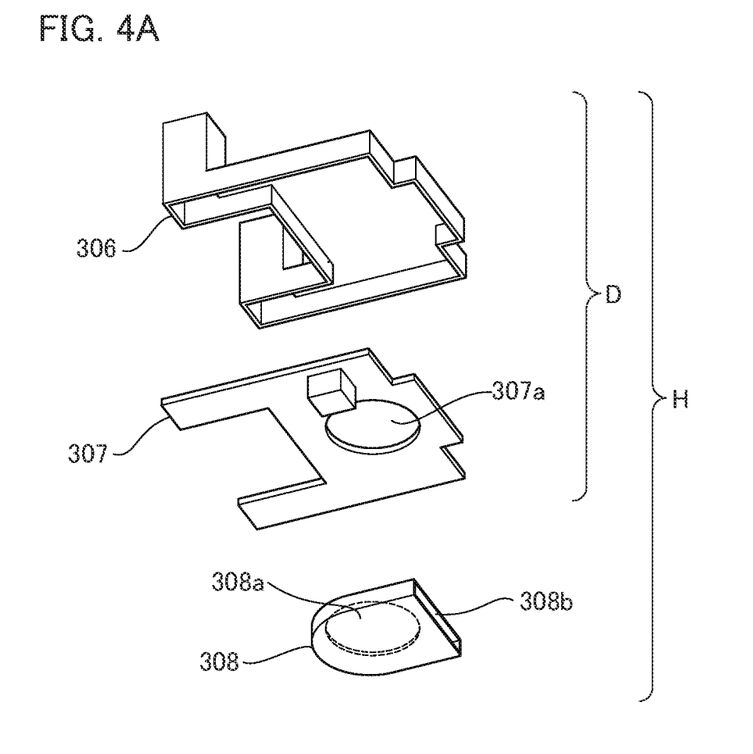
FIGS. 4A and 4B are a perspective view of a heat dissipation unit according to the embodiment, and an explanatory diagram and an exploded perspective view of a gas flow.
Figure 4B:
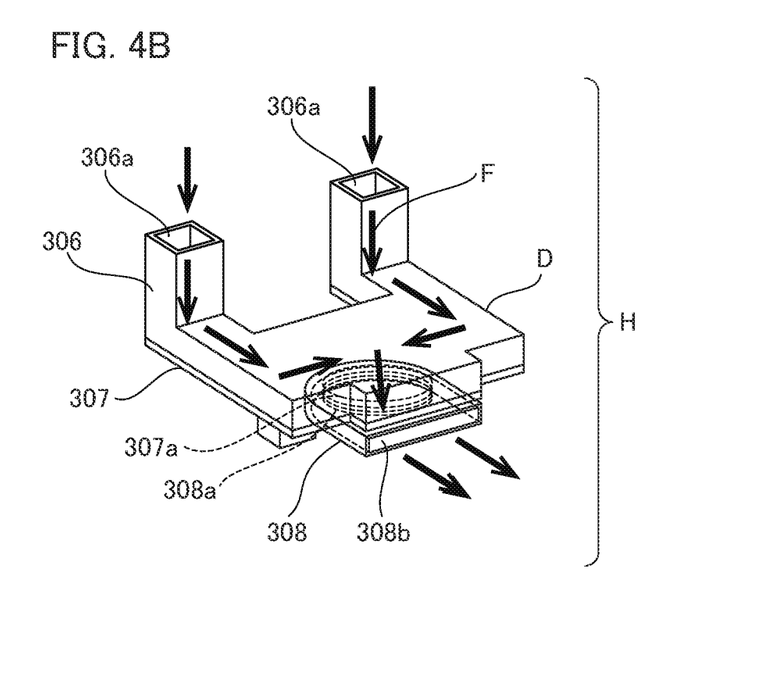

The heat dissipation unit H dissipates the heat generated by the first substrate 203, the second substrate 304, the third substrate 310, and the like to the outside. The heat dissipation unit H is fixed to the base case 302 by a fixing member such as a screw or the like (not shown). Details of the heat dissipation unit H will be described below with reference to FIG. 4.

The second thermally conductive member 305 is fixed to be interposed between the second substrate 304 and a duct D, and conducts the heat generated from the second substrate 304 to the duct D. As a result, the second substrate 304 is thermally connected to the heat dissipation unit H.

The third substrate 310 is a print substrate on which the video processing engine, the communication processing engine, the memory, and the like (not shown) are mounted, and which generates heat by implementing each process, and is fixed to the base case 302 by a fixing member such as a screw or the like (not shown). The third thermally conductive member 309 is fixed to be interposed between the third substrate 310 and the duct D, and conducts heat generated from the third substrate 310 to the duct D. As a result, the third substrate 310 is thermally connected to the heat dissipation unit H.

When the second substrate 304 and the third substrate 310 are disposed to vertically sandwich the heat dissipation unit H via the second thermally conductive member 305 and the third thermally conductive member 309, it is possible to conduct heat from both an upper surface and a lower surface of the duct D of the heat dissipation unit H. For this reason, in the configuration of the video camera 1 of the first embodiment, it is desirable to dispose them in such a manner to improve heat dissipation capability.

The bottom case 311 is an exterior that is fixed to the base case 302 by a fixing member such as a screw or the like (not shown) and configured to cover a bottom surface of the base unit 30. The backside case 312 is an exterior that is fixed to the base case 302 by a fixing member such as a screw or the like (not shown), and that covers a back surface of the base unit 30. The backside case 312 has a backside case hole 312b configured as a through hole and a backside case exhaust port 312a functioning as an exhaust port for air (gas) discharged by an air blower 308.

The external connection terminal 313 is an external interface of the video camera 1. The external connection terminal 313 is disposed to be connectable to a device outside a body from the backside case hole 312b. Examples of the external connection terminal 313 include a power connection connector, a video-out connector, an external input/output connector, an RJ45 connector, and an SD card. The external connection terminal 313 operates in electrical connection with a substrate such as the second substrate 304 by an electrical connection component such as substrate mounting or a cable.

FIG. 4 is an example of an exploded perspective view of the heat dissipation unit H and an explanatory diagram and a perspective view of an air flow F according to the first embodiment. FIG. 4A is a view which shows an example of the exploded perspective view of the heat dissipation unit H according to the first embodiment. FIG. 4B is an explanatory diagram of the heat dissipation unit H and the air flow F according to the first embodiment.

The heat dissipation unit H is configured from the duct D and the air blower 308. The duct D is configured from an upper duct 306 and a bottom duct 307. The upper duct 306 and the bottom duct 307 are fixed to each other by a fixing member such as a screw (not shown). In addition, the upper duct 306 and the bottom duct 307 are configured to be substantially sealed such that they have a space serving as an air passage inside when they are fixed to each other. The upper duct 306 has an upper duct inlet port 306a configured to face the pan-base base portion 202a. Although two inlet ports are formed in the upper duct 306 in the first embodiment, at least one inlet port may be formed without being limited thereto. The bottom duct 307 has a bottom duct hole 307a.

The air blower 308 has an air blower inlet port 308a and an air blower exhaust port 308b. The air blower 308 operates by being electrically connected to, for example, a substrate, such as the second substrate 304, takes air in through the air blower inlet port 308a, and exhausts the air through the air blower exhaust port 308b, and thereby, the air flow F is generated in a direction of an arrow as shown in FIG. 4B. The air blower 308 is, for example, a fan, such as a centrifugal fan.

The air blower 308 is fixed to the bottom duct 307 by a fixing member such as a screw or the like (not shown) so that the air blower inlet port 308a faces the bottom duct hole 307a. In addition, when it is fixed, it is desirable to dispose an elastic member (not shown) surrounding the air blower inlet port 308a and the bottom duct hole 307a. By disposing the elastic member, it is possible to improve the sealing property. In the first embodiment, one exhaust port is formed in the air blower 308, but the present invention is not limited to this and a plurality of exhaust ports may also be formed.

With the configuration of the heat dissipation unit H described above, when the air blower 308 operates, air can be taken into the duct D through the upper duct inlet port 306a and the air can be exhausted through the air blower exhaust port 308b. That is, it is possible to generate the air flow F as shown in FIG. 4A. In addition, by disposing the heat dissipation unit H inside the base unit 30, it is possible to dissipate heat by bringing a member having heat into contact with the duct D while the air blower 308 operates.

In addition, it is desirable that each of the upper duct 306 and the bottom duct 307 be formed of a material having high thermal conductivity to improve heat dissipation performance as the heat dissipation unit H.

Figure 5:
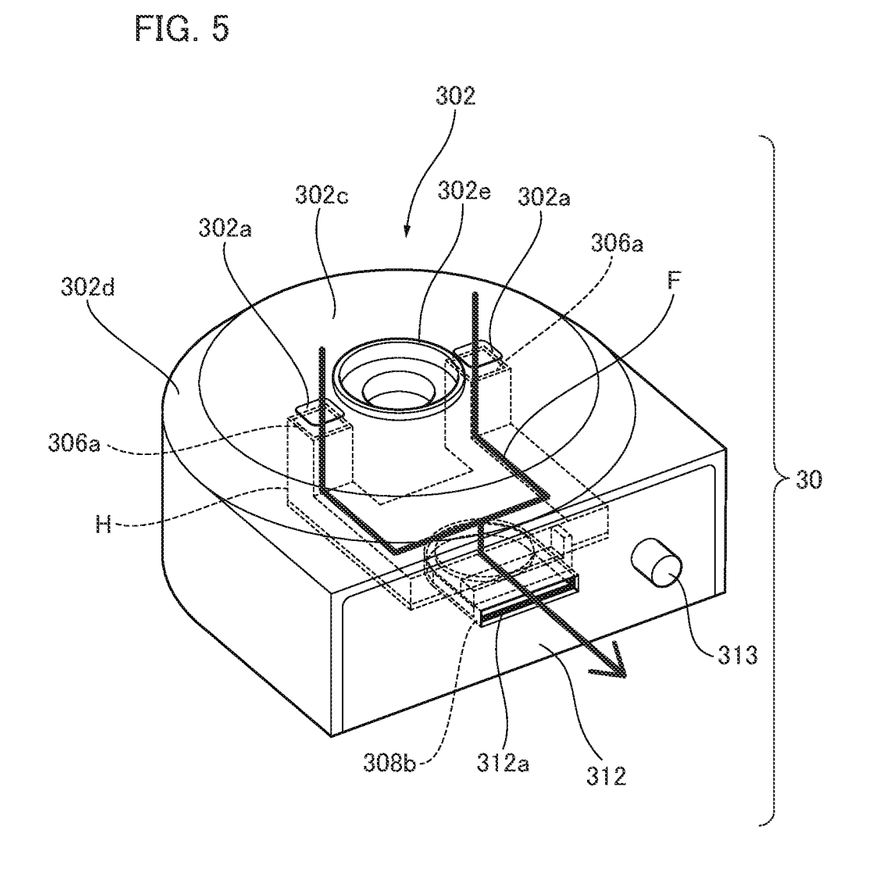
FIG. 5 is a perspective view of a base unit of the video camera according to the embodiment and an explanatory diagram of a gas flow.

FIG. 5 is an example of a perspective view of the base unit 30 of the video camera 1 and an explanatory diagram of the air flow F according to the first embodiment. The base unit 30 incorporates the heat dissipation unit H as shown in FIG. 5. A base case inlet port (a hole portion) 302a is formed in the base case 302 so as to face the pan-base base portion 202a on an upper surface portion 302c.

The base case inlet port 302a is configured at substantially the same position as the upper duct inlet port 306a when viewed from a top surface of the video camera 1. That is, the base case inlet port 302a also functions as an inlet port of the heat dissipation unit H. Moreover, the base case inlet port 302a and the upper duct inlet port 306a are formed in a substantially rectangular shape as shown in FIGS. 4 and 5 in the first embodiment, but may also be formed in a circular shape or an elliptical shape without being limited thereto.

In addition, it is desirable that the base case inlet port 302a and the upper duct inlet port 306a be configured to have substantially the same shape. At least one base case inlet port 302a may be formed, but it is desirable to form base case inlet ports as many as the number of upper duct inlet ports 306a. In that case, it is desirable that they be disposed at substantially the same position when viewed from the top surface of the video camera 1.

In addition, the backside case exhaust port 312a is formed in the backside case 312 as described above. The backside case exhaust port 312a is configured at substantially the same position as the air blower exhaust port 308b when viewed from a back surface of the video camera 1. That is, the backside case exhaust port 312a also functions as an exhaust port of the heat dissipation unit H. Moreover, the air blower exhaust port 308b and the backside case exhaust port 312a are formed in a substantially rectangular shape as shown in FIGS. 4 and 5 in the first embodiment, but may also be formed in a circular shape or an elliptical shape without being limited thereto. In addition, it is desirable that the backside case exhaust port 312a and the air blower exhaust port 308b be configured to have substantially the same shape. At least one backside case exhaust port 312a may be formed, but it is desirable to form backside case exhaust ports 312a as many as the number of air blower exhaust ports 308b. In that case, it is desirable that they be disposed at substantially the same position when viewed from the back surface of the video camera 1 in the same manner as described above.

With the configuration described above, in the base unit 30, when the air blower 308 is operated, air can be taken in through the base case inlet port 302a and exhausted through the backside case exhaust port 312a, like the air flow F shown in FIG. 5.

In addition, a receiving portion (a recess) in which the pan rotation bearing 301 is disposed is formed in the base case 302, an outer peripheral portion of the receiving portion has a predetermined thickness in the horizontal direction, and is formed as a rib 302e that protrudes toward the pan-base base portion 202a further than the upper surface portion 302c. The rib 302e is formed over an entire circumference of the receiving portion as shown in FIG. 5.

Figure 6:
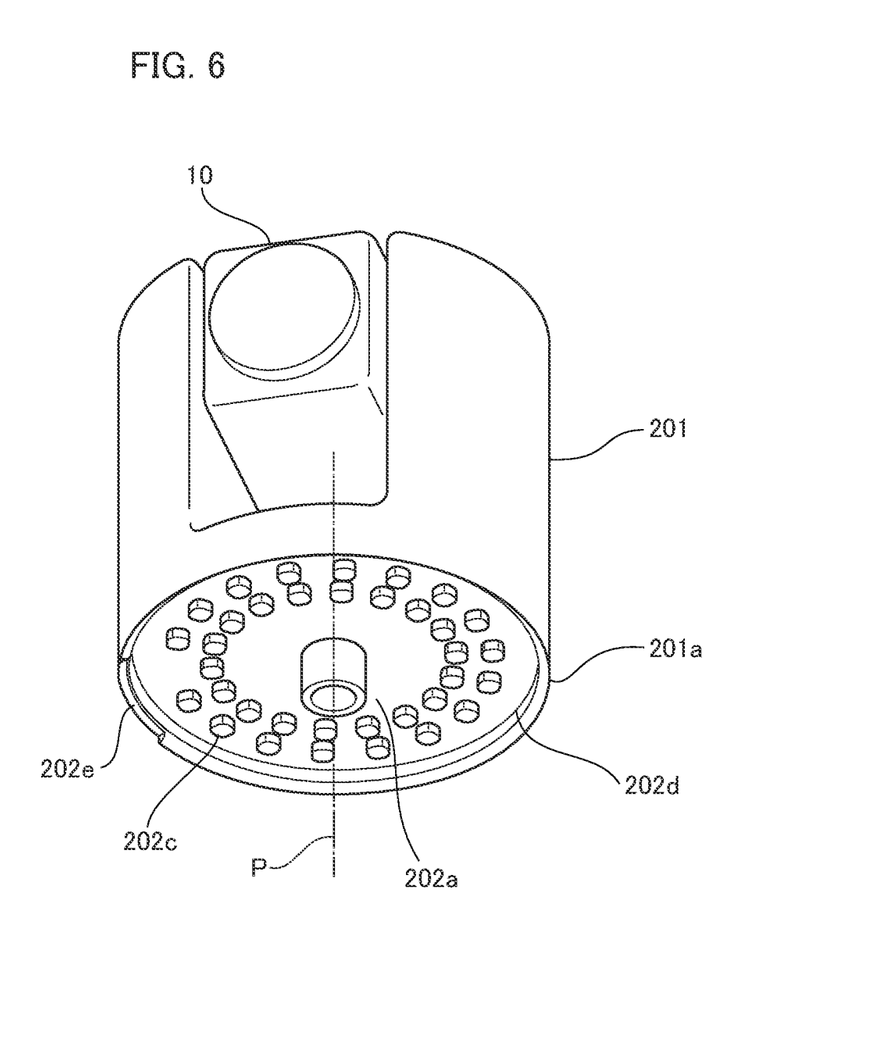
FIG. 6 is a perspective view of a camera unit and a pan base unit according to the embodiment.

FIG. 6 is a perspective view of the camera unit 10 and the pan base unit 20 according to the first embodiment. As described above, the protrusion portion 202c is formed in the pan-base base portion 202a. The protrusion portion 202c is formed to protrude from the pan-base base portion 202a toward the base case 302 side by a predetermined amount, as shown in FIG. 6. In addition, the pan base case bottom portion 201a has a notch portion 202e formed along a rotation direction of the base unit 30. It is desirable that at least one notch portion 202e is formed in the pan base case bottom portion 201a to be positioned close to at least one of the first substrate 203 and the second substrate 304 when the video camera 1 is assembled. A size of the notch portion 202e can be arbitrary.

The pan-base outer peripheral portion 202d is formed to have substantially the same size as an inner circumference of the pan base case 201. Then, when the pan base case 201 is attached to the pan base 202, the pan-base outer peripheral portion 202d can be attached in substantially close contact with the pan base case bottom portion 201a over the entire circumference. As a result, an inside (an inner side) of the pan base case 201 can be substantially sealed. Due to such a substantially sealed structure, it is possible to curb air flowing between the pan-base base portion 202a and the base case 302 from flowing into the inside of the pan base case 201 from the pan-base outer peripheral portion 202d. In addition, when the air blower 308 is operated, it is possible to curb foreign matter such as dust from entering an inside of the pan base case 201.

Figure 7:
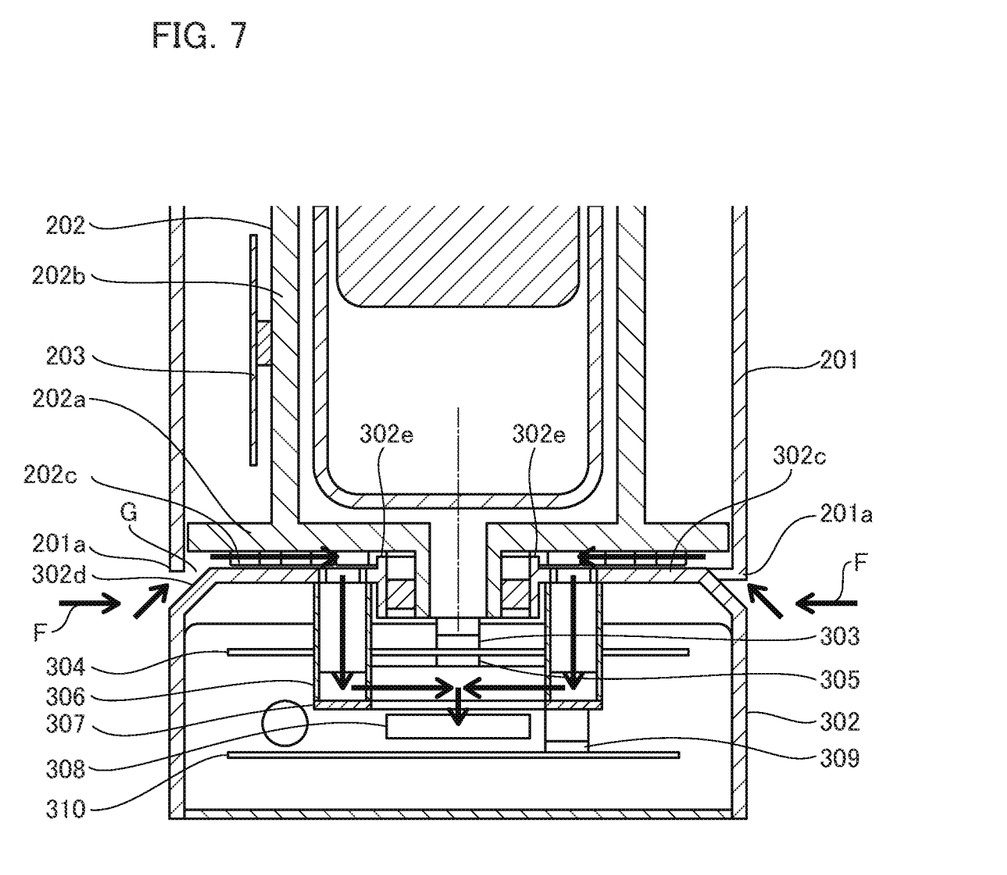
FIG. 7 is a cross-sectional view of a video camera according to the embodiment and an explanatory diagram of a gas flow.
Figure 8A:
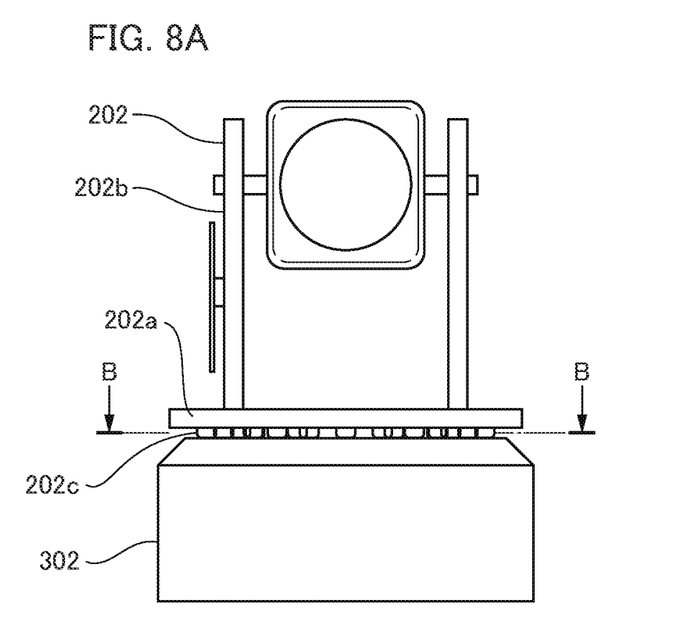
FIGS. 8A and 8B are a cross-sectional view of the base of the pan base of the video camera according to the embodiment and an explanatory diagram of a gas flow.
Figure 8B:
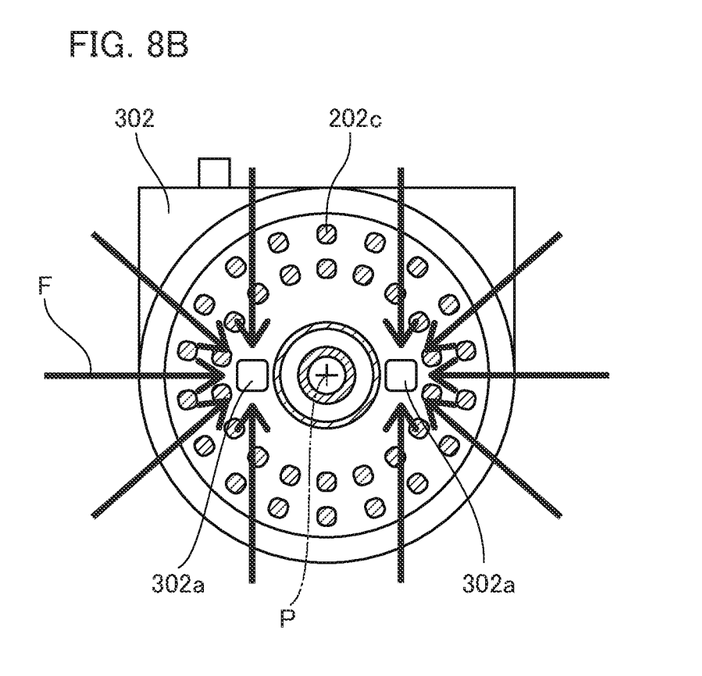
Figure 9:
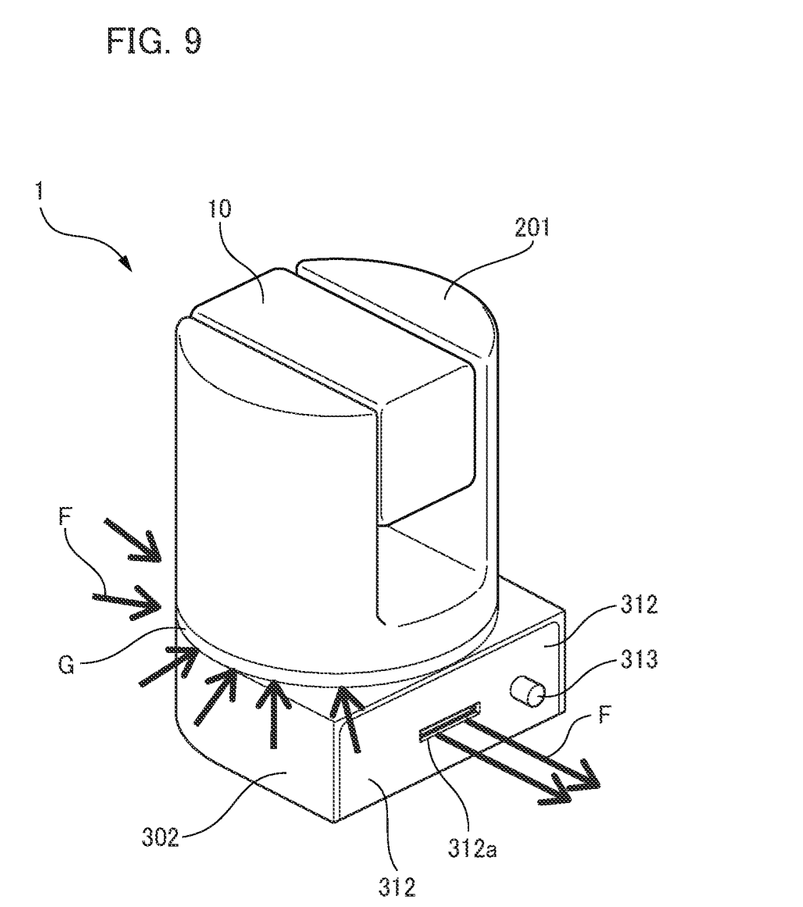
FIG. 9 is a perspective view of the video camera according to the embodiment and an explanatory diagram of a gas flow.

FIG. 7 is a cross-sectional view of the video camera 1 according to the first embodiment, which is viewed from the cross section A, and is an explanatory diagram of the air flow F when viewed from the cross section A. FIG. 8 is a cross-sectional view of the video camera 1 according to the first embodiment, which is viewed from a cross section B, and is an explanatory diagram of the air flow F. FIG. 8A is a view of the video camera 1, which is viewed in a front surface direction. FIG. 8B is a cross-sectional view, viewed from the cross section B of FIG. 8A, and is an explanatory diagram of the air flow F. FIG. 9 shows a perspective view of the video camera 1 according to the first embodiment and is an explanatory diagram of the air flow F.

As shown in FIG. 7, there is a gap G between the pan base case 201 and the base case 302. Specifically, the gap G is formed over the entire circumference between the surface of the pan-base base portion 202a of the pan base case 201 on the side of the base case 302 and the upper surface portion 302c of the base case 302 facing the surface. The gap G functions as an air passage through which air passes. In addition, as shown in FIG. 7, air can enter the gap G through an opening formed between the pan base case bottom portion 201a of the pan base case 201 and a slope portion 302d of the base case 302.

Here, when the air blower 308 is driven, air enters the gap G through the opening described above as indicated by an arrow indicating the air flow F. After the air enters the gap G, the air passes through the gap G, the base case inlet port 302a, the upper duct inlet port 306a, and an inside of the heat dissipation unit H in this order, and is exhausted to the outside of the video camera 1 from the backside case exhaust port 312a through the air blower exhaust port 308b.

When the air flows through the gap G that functions as an air passage, it flows along the pan-base base portion 202a and the plurality of protrusion portions 202c, so that an air flow can be created in the gap G efficiently as compared to a case in which there are no protrusion portions 202c. As a result, the heat of the pan base 202 can be efficiently removed. Moreover, a portion of the opening described above is enlarged by providing the notch portion 202e, so that the amount of air caused to enter the gap G can be increased compared to a state in which there are no notch portions 202e.

In addition, when the video camera 1 is assembled, an interval between a surface of the rib 302e on the pan-base base portion 202a side described above and the pan-base base portion 202a is configured to be narrower than an interval of the gap G described above. As a result, when the air blower 308 is operated, it is possible to curb foreign matter such as dust from entering the receiving portion.

Here, as shown in FIG. 8B, it is desirable that the base case inlet port 302a be formed at a position close to the pan rotation axis P so that it is in contact with the pan-base base portion 202a and the protrusion portion 202c with a larger surface area as the air passes through the air passage. For this reason, it is desirable that the protrusion portion 202c be formed at a position farther from the pan rotation axis P than the base case inlet port 302a. In addition, the protrusion portion 202c can have any disposed position and any interval as long as it is positioned as described above, but it is desirable that it be disposed in a radial shape from the pan rotation axis P toward the pan-base outer peripheral portion 202d as shown in FIG. 8B to efficiently remove heat of the pan base 202. Heat dissipation paths of each substrate that generates heat will be described below.

(Heat Dissipation Path of First Substrate)

Heat generated in the first substrate 203 is conducted to the pan base 202 via the first thermally conductive member 204. When the air blower 308 is driven, air flows through the gap G functioning as an air passage. At this time, the air flows along the pan-base base portion 202a and the protrusion portion 202c of the pan base 202. After that, the heated air enters an inside of the heat dissipation unit H from the base case inlet port 302a, passes through the heat dissipation unit H, and is exhausted to the outside of the video camera 1 from the backside case exhaust port 312a. As a result, the heat generated by the first substrate 203 can be dissipated to the outside of the video camera 1.

(Heat Dissipation Path of Second Substrate)

Heat generated in the second substrate 304 is conducted to the upper duct 306 via the second thermally conductive member 305. When the air blower 308 is driven, the heat conducted to the duct D is transferred to air inside the duct D, and the heated air passes through the inside of the duct D and is exhausted to the outside of the video camera 1 through the backside case exhaust port 312a. As a result, the heat generated by the second substrate 304 can be dissipated to the outside of the video camera 1.

(Heat Dissipation Path of Third Substrate)

Heat generated in the third substrate 310 is conducted to the bottom duct 307 via the third thermally conductive member 309. When the air blower 308 is driven, the heat conducted to the duct D passes through the inside of the duct D and is exhausted to the outside of the video camera 1 through the backside case exhaust port 312a. As a result, the heat generated by the third substrate 310 can be dissipated to the outside of the video camera 1.

With the above configuration, the heat generated in the first substrate 203, the second substrate 304, and the third substrate 310 can be dissipated to the outside of the video camera 1 by operating the heat dissipation unit H disposed in the base unit 30 of the first embodiment.

In addition, by disposing the external connection terminal 313 and the backside case exhaust port 312a of the heat dissipation unit H on the same surface, a design property of the base unit 30 can be improved.

As described above, in the video camera 1 of the first embodiment, the heat emitted by the first substrate 203 disposed in the pan base 202 can be efficiently dissipated by the heat dissipation unit H disposed in the base unit 30. As a result, compared to a case in which the heat dissipation unit H is disposed in the pan base 202, it is possible to make the image capturing apparatus smaller, to reduce a weight of a unit that causes pan rotation, and to improve an acceleration of the pan rotation. In addition, by disposing the second substrate 304 and the third substrate 310 so that they sandwich the duct D therebetween, it is possible to efficiently dissipate the heat generated from each substrate to the outside of the video camera 1 by the heat dissipation unit H.

The configuration of the present invention is not limited to the video camera exemplified in the embodiment described above, and a material, a shape, a size, a form, the number, a disposition location, and the like thereof can be changed as appropriate within a range not departing from the gist of the present invention.

In addition, it goes without saying that the object of the present invention is achieved by the following. That is, a recording medium (or a storage medium) in which a program code of software (a computer program) for realizing functions of the embodiment described above is recorded is supplied to a system or a device. Such a storage medium is, of course, a computer-readable storage medium. Then, a computer (or a CPU or MPU) of the system or device reads and executes the program code stored in the recording medium. In this case, the program code itself read out from the recording medium realizes the functions of the embodiment described above, and the recording medium in which the program code is recorded constitutes the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-094999, Jun. 13, 2022, which is hereby incorporated by reference wherein in its entirety.

What is claimed is:

1. An image capturing apparatus configured to capture an image of a subject comprising:
   a camera unit;
   a first unit configured to rotatably support the camera unit around an axis in a first direction;
   a second unit configured to rotatably support the first unit around an axis in a second direction;
   a first substrate configured to be fixed to the first unit; and
   a radiating unit configured to be fixed to the second unit and to allow heat generated by at least the first substrate to be dissipated to an outside of the image capturing apparatus,
   wherein at least one inlet port and an exhaust port are formed in the heat dissipation unit, and
   the inlet port is configured to face the first unit and the exhaust port is disposed on a side surface of the second unit,
   wherein the first unit has a base portion, a support portion configured to protrude toward the camera unit and formed on a first surface of the based portion, and at least one protrusion portion configured to protrude toward the second unit and formed on a second surface that is a surface on an opposite side to the first surface of the base portion.

2. The image capturing apparatus according to claim 1, wherein the heat dissipation unit is disposed inside the second unit.

3. The image capturing apparatus according to claim 1, wherein the inlet port of the heat dissipation unit is disposed at a position closer to a center of a rotation axis in the first direction than the protrusion portion.

4. The image capturing apparatus according to claim 1, wherein the first substrate is fixed to the support portion.

5. The image capturing apparatus according to claim 1, wherein a plurality of protrusion portions configured to protrude toward the second unit are formed on a second surface that is surface on an opposite side to a first surface in a base portion of the first unit, and
   the plurality of protrusion portions are disposed radially from the center of the rotation axis in the first direction to an outer peripheral portion of the first unit.

6. The image capturing apparatus according to claim 1, further comprising:
   a second substrate that is fixed to the second unit,
   wherein the second substrate is thermally connected to the heat dissipation unit.

7. The image capturing apparatus according to claim 6, further comprising:
   a third substrate that is fixed to the second unit,
   wherein the third substrate is thermally connected to the heat dissipation unit.

8. The image capturing apparatus according to claim 7, wherein the second substrate and the third substrate are disposed to vertically sandwich the heat dissipation unit therebetween.

9. The image capturing apparatus according to claim 1, wherein at least one connection terminal is disposed on a side surface of the second unit.

10. The image capturing apparatus according to claim 1, wherein the second unit has a hole portion formed at a position at which the inlet port of the heat dissipation unit is disposed.

11. The image capturing apparatus according to claim 1, wherein the heat dissipation unit is formed of a thermally conductive member.

12. The image capturing apparatus according to claim 1, wherein the first unit is formed of a metal member.

13. The image capturing apparatus according to claim 1, wherein a gap of a predetermined width is provided between the second surface of the base portion and a surface of the second unit facing the second surface.

14. The image capturing apparatus according to claim 13, wherein the heat dissipation unit includes an air blower, air is taken in from the outside of the image capturing apparatus, and the intake air proceeds to the gap, the inlet port, and an inside of the heat dissipation unit in order and is discharged from the exhaust port to the outside of the image capturing apparatus by driving the air blower.

15. The image capturing apparatus according to claim 1, further comprising:
an external portion that is formed to cover the first unit and the first substrate,
wherein a bottom portion of the exterior portion and an outer peripheral portion of the base portion are in close contact with each other.

16. The image capturing apparatus according to claim 15, wherein the bottom portion of the exterior portion has a notch portion formed along a rotation direction of the second unit.

17. The image capturing apparatus according to claim 1, wherein the first direction is a horizontal direction, and the second direction is a vertical direction.

\* \* \* \* \*